(12) United States Patent
Watanabe et al.

(10) Patent No.: US 8,305,152 B2
(45) Date of Patent: Nov. 6, 2012

(54) MEMS OSCILLATOR AND METHOD OF MANUFACTURING THEREOF

(75) Inventors: Toru Watanabe, Matsumoto (JP); Shogo Inaba, Shiojiri (JP); Ryuji Kihara, Matsumoto (JP)

(73) Assignee: Seiko Epson Corporation (JP)

( * ) Notice: Subject to any disclaimer, the term of this patent is extended or adjusted under 35 U.S.C. 154(b) by 45 days.

(21) Appl. No.: 12/974,258

(22) Filed: Dec. 21, 2010

(65) Prior Publication Data

US 2011/0148537 A1    Jun. 23, 2011

(30) Foreign Application Priority Data

Dec. 22, 2009  (JP) ................. 2009-290171

(51) Int. Cl.
    H03B 5/30     (2006.01)
    H03H 9/205    (2006.01)

(52) U.S. Cl. ........ 331/154; 331/156; 331/179; 331/185; 333/189; 333/197; 333/200

(58) Field of Classification Search ............. 331/116 M, 331/116 R, 154, 156, 179, 185, 186; 333/186–189, 333/197–200
See application file for complete search history.

(56) References Cited

U.S. PATENT DOCUMENTS

| | | | | |
|---|---|---|---|---|
| 5,994,982 A * | 11/1999 | Kintis et al. | ................. | 333/235 |
| 6,803,840 B2 * | 10/2004 | Hunt et al. | ................. | 333/186 |
| 7,463,105 B2 * | 12/2008 | Morita et al. | ................. | 331/154 |
| 7,463,116 B2 * | 12/2008 | Naniwada | ................. | 333/186 |
| 7,498,901 B2 * | 3/2009 | Naniwada et al. | ............ | 333/133 |
| 7,671,430 B2 | 3/2010 | Inaba et al. | | |
| 7,726,189 B2 * | 6/2010 | Vyas et al. | ................. | 73/580 |
| 7,868,709 B2 * | 1/2011 | Shinogi | ................. | 331/156 |
| 7,876,177 B2 * | 1/2011 | Nl | ................. | 333/186 |
| 7,915,973 B2 * | 3/2011 | Zettl et al. | ................. | 333/186 |
| 7,941,723 B1 * | 5/2011 | Lien et al. | ................. | 714/744 |
| 7,990,233 B2 * | 8/2011 | Suzuki | ................. | 333/186 |
| 2008/0143450 A1 * | 6/2008 | Matsumoto et al. | ...... | 331/116 R |
| 2009/0179287 A1 | 7/2009 | Inaba | | |
| 2009/0315645 A1 | 12/2009 | Watanabe | | |
| 2009/0315646 A1 | 12/2009 | Watanabe | | |
| 2010/0109815 A1 | 5/2010 | Inaba et al. | | |
| 2010/0176898 A1 | 7/2010 | Kihara | | |
| 2010/0178717 A1 | 7/2010 | Kihara et al. | | |

FOREIGN PATENT DOCUMENTS

| | | |
|---|---|---|
| JP | 2008-153817 | 7/2008 |
| JP | 2009-184102 | 8/2009 |
| JP | 2009-212887 | 9/2009 |
| JP | 2009-212888 | 9/2009 |
| JP | 2010-004104 | 1/2010 |
| JP | 2010-028792 | 2/2010 |
| JP | 2010-158734 | 7/2010 |
| JP | 2010-162629 | 7/2010 |
| JP | 2010-166201 | 7/2010 |
| JP | 2010-166620 | 7/2010 |

* cited by examiner

Primary Examiner — Levi Gannon
(74) Attorney, Agent, or Firm — Harness, Dickey & Pierce, P.L.C.

(57) ABSTRACT

An oscillator includes: a plurality of MEMS vibrators formed on a substrate; and an oscillator configuration circuit connected to the plurality of MEMS vibrators, wherein the plurality of MEMS vibrators each have a beam structure, and the respective beam structures are different, whereby their resonant frequencies are different.

12 Claims, 16 Drawing Sheets

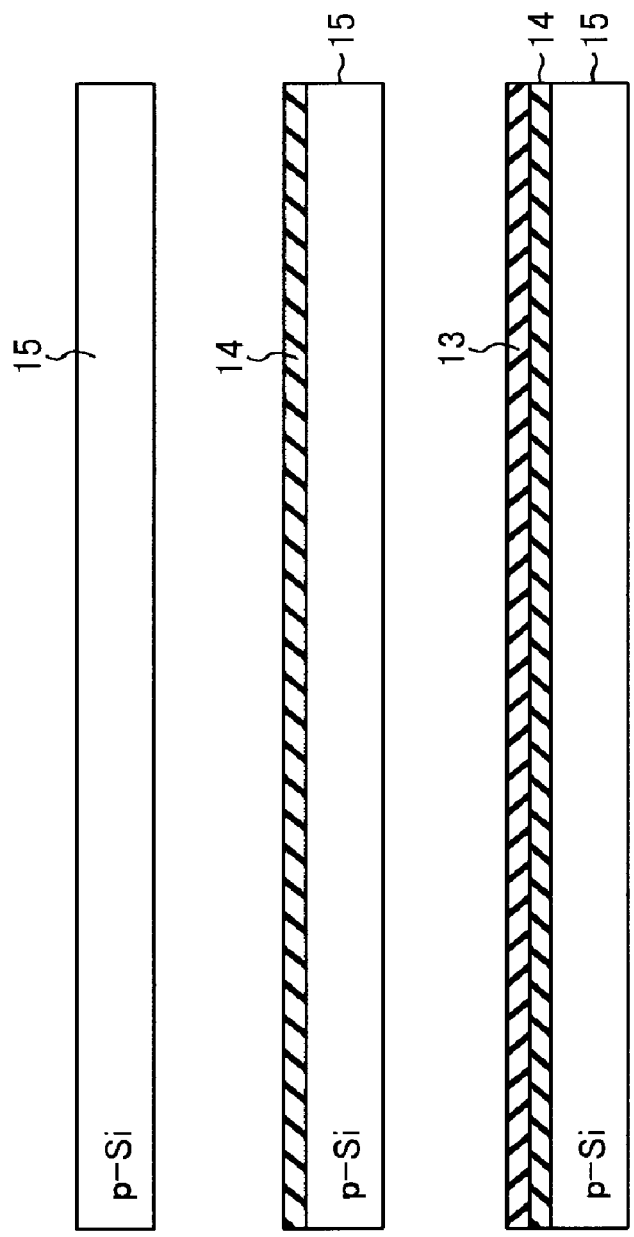

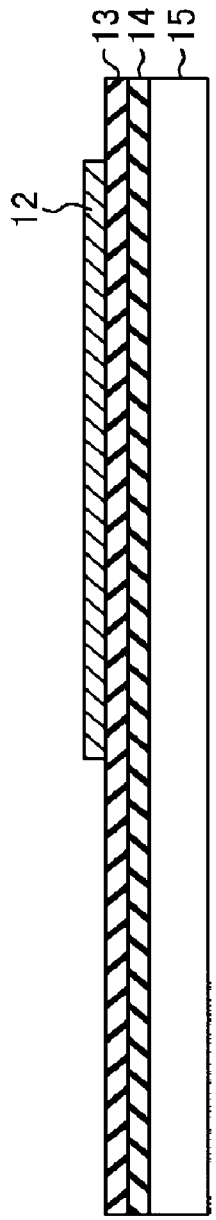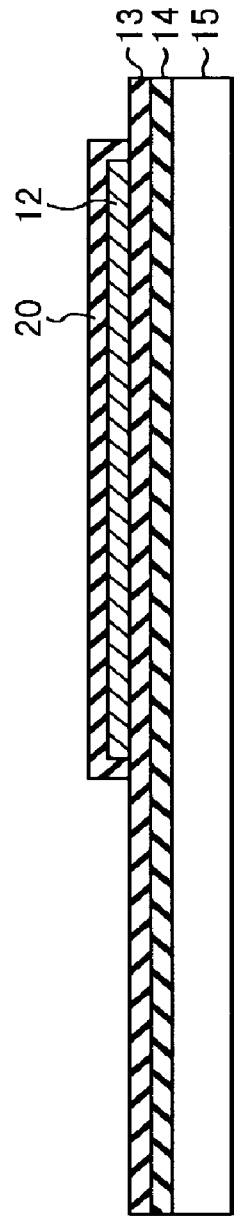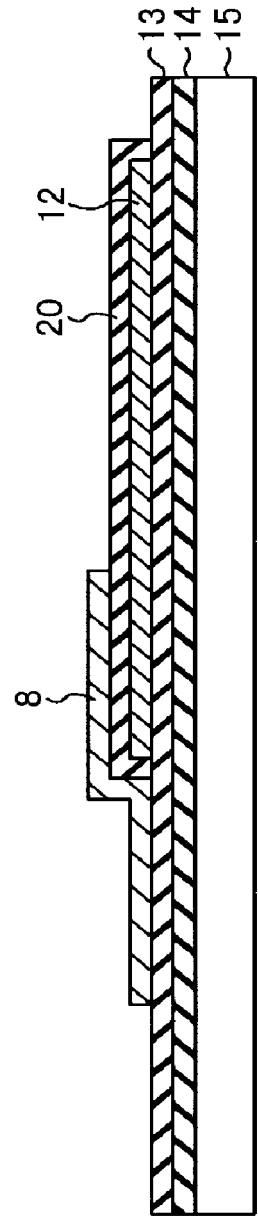

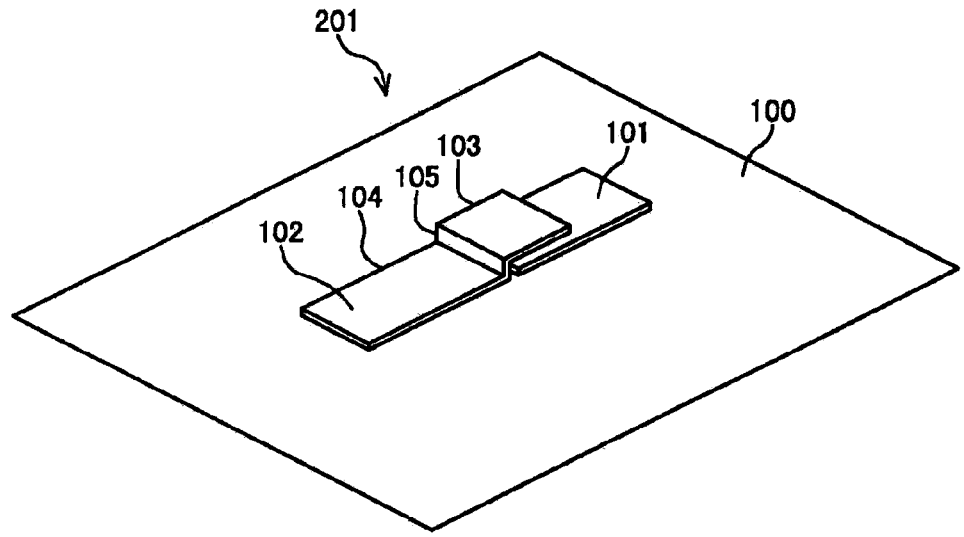
FIG.15
PRIOR ART
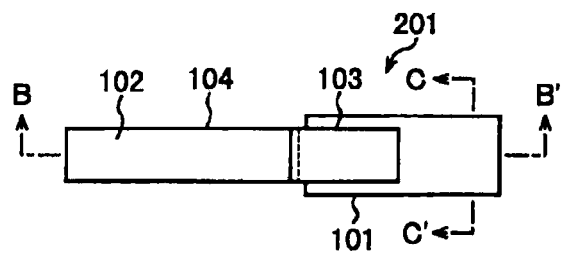
FIG.16A
PRIOR ART
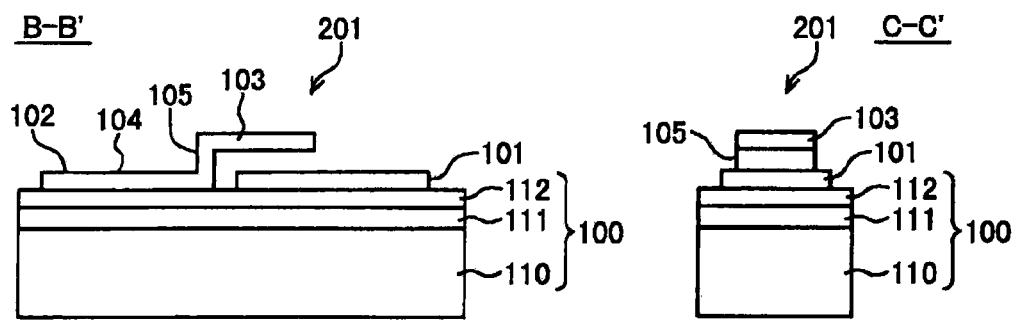
FIG.16B
PRIOR ART
FIG.16C
PRIOR ART

MEMS OSCILLATOR AND METHOD OF MANUFACTURING THEREOF

BACKGROUND

1. Technical Field

The present invention relates to a MEMS oscillator including a MEMS vibrator and a method of manufacturing thereof.

2. Related Art

FIG. 13 shows the circuit configuration of a related-art MEMS vibrator. One of electrodes of the MEMS vibrator 201 is connected to a coupling capacitance 203a, and the coupling capacitance 203a is connected to an input terminal. The other electrode of the MEMS vibrator 201 is connected to a coupling capacitance 203b, and the coupling capacitance 203b is connected to an output terminal 220. A bias voltage applying circuit 202 is connected between the electrodes of the MEMS vibrator 201 via bias resistances 204a and 204b.

When the MEMS vibrator 201 is operated, a DC bias voltage is applied between the electrodes of the MEMS vibrator 201 by the bias voltage applying circuit 202 including a reference voltage generating circuit so that the MEMS vibrator 201 is free from the influence of an external DC voltage. The input terminal 210 and the output terminal 220 which are coupled to an external circuit and the electrodes of the MEMS vibrator 201 are connected via the coupling capacitances 203a and 203b. To obtain AC insulation between the bias voltage applying circuit 202 which applies the DC bias voltage and the electrodes of the MEMS vibrator 201, the bias resistances 204a and 204b are inserted between the electrodes of the MEMS vibrator 201 and the bias voltage applying circuit 202.

FIG. 14 shows an exemplary MEMS oscillator including the related-art MEMS vibrator and an oscillator circuit. One of the electrodes of the MEMS vibrator 201 is connected to the coupling capacitance 203a, while the other electrode of the MEMS vibrator 201 is connected to the coupling capacitance 203b. The bias circuit 202 is connected between the electrodes of the MEMS vibrator 201, and a bias voltage input terminal is connected to the bias circuit 202. The coupling capacitance 203a is connected to an input side of an amplifier circuit 230, while the coupling capacitance 203b is connected to an output side of the amplifier circuit 230. The output side of the amplifier circuit 230 and the coupling capacitance 203b are connected to an input side of a buffer circuit (buffer amplifier) 240, while an output side of the buffer circuit 240 is connected to an output terminal.

For the MEMS vibrator 201, a MEMS vibrator utilizing change in electrostatic capacitance due to mechanical displacement is generally used in many cases. As the simplest structure, a cantilever structure can be cited as a representative example. FIG. 15 shows an exemplary appearance of the MEMS vibrator 201 using this structure; and FIGS. 16A to 16C show the configuration of the MEMS vibrator 201 in detail.

As shown in FIGS. 15 and 16A, the MEMS vibrator 201 is composed of a fixed electrode 101 formed on a substrate 100 and a movable electrode 102 formed apart from the fixed electrode 101 with a constant gap. The movable electrode 102 is composed of a fixed portion 104 formed on the substrate 100, a movable portion (beam) 103 provided to face the fixed electrode 101 and capable of vibrating, and a supporting portion 105 coupling the movable portion 103 with the fixed portion 104 and supporting them (refer to JP-A-2008-153817 (FIG. 2), for example).

A method of manufacturing the MEMS vibrator 201 is as follows.

As shown in FIGS. 16B and 16C, a silicon oxide film 111 is formed on a Si substrate 110, and a silicon nitride film 112 is formed on the silicon oxide film 111. Next, the fixed electrode 101 formed of a first polysilicon film is formed on the silicon nitride film 112, and an insulating film (not shown) covering the fixed electrode 101 is formed. Next, the movable electrode 102 formed of a second polysilicon film is formed on the insulating film. Next, the insulating film around the movable electrode 102 is removed. In this manner, the MEMS vibrator 201 is manufactured.

In the MEMS vibrator 201, the movable portion 103 vibrates in a thickness direction of the substrate 100. Since the gap between the movable portion 103 and the fixed electrode 101 can be set narrow, the capacitance change rate relative to the fluctuation of the movable portion 103 is high, so that the MEMS vibrator 201 can obtain high sensitive resonance characteristics.

The MEMS vibrator 201 is manufactured by a so-called surface MEMS process in which the fixed electrode 101 and the movable electrode 102 are formed by depositing polysilicon or the like by a CVD (chemical vapor deposition) method. Since the MEMS vibrator 201 can be formed by the relatively simple process, it has such an advantage that the MEMS vibrator can be manufactured at low cost.

On the other hand, the MEMS vibrator 201 has the following disadvantage.

As described above, since the fixed electrode 101 and the movable electrode 102 are formed by depositing polysilicon or the like by a CVD method, the film formation by deposition results in great variation in film thickness, and the tolerance usually reaches up to ±10% in some cases. In a vibration mode, since the film thickness of the fixed electrode 101 and the movable electrode 102 serves as a factor in determining the resonant frequency of the vibrator, the variation in film thickness is directly linked to variation in resonant frequency. Therefore, in the fixed electrode 101 and the movable electrode 102 formed by depositing polysilicon or the like, there is a problem that it is difficult to obtain relatively high frequency accuracy compared to a vibrator which vibrates in a horizontal direction of a substrate.

Means for securing resonant frequency accuracy by managing and selecting the film thickness, optimizing the beam strength, or the like is also conceivable. In view of mass production, however, the process control has its limit, and an increase in manufacturing cost due to the addition of processes therefor is of concern.

FIG. 17 shows the relation between variation in resonant frequency caused by variation in the fixed electrode and movable electrode of a MEMS vibrator and the target accuracy (tolerance) of resonant frequency required for the MEMS vibrator as a product. However, the degree of variation in film thickness varies depending on the performance of a film-forming apparatus, film-forming conditions, and the like, and therefore, the variation in resonant frequency shown in FIG. 17 is illustrative only. The target accuracy also varies depending on products, and therefore, the target accuracy shown in FIG. 17 is illustrative only.

For example, when the specification value for the resonant frequency and frequency accuracy of a MEMS vibrator is 20 MHz±100 kHz (±0.5%), the resonant frequency of the vibrator has to fall within a range from 19.9 MHz to 20.1 MHz. For realizing this, the variation in the film thickness of the MEMS vibrator has to be a desired value or less (for example, within ±0.05 μm).

As described above, however, if the variation in the film thickness of the MEMS vibrator results in, for example, four times the desired value (for example, ±0.2 μm) due to the performance of a film-forming apparatus, or film-forming conditions, it is presumed that the resonant frequency of MEMS vibrators which are mass-produced under this condition varies from 19.6 MHz to 20.4 MHz (±400 kHz=±2%).

As described above, when the variation in resonant frequency caused by the variation in film thickness is great compared to the target accuracy required as a product, the related-art manufacturing method cannot obtain a MEMS vibrator having a resonant frequency within the target accuracy with high yield.

SUMMARY

An advantage of some aspects of the invention is to provide a MEMS oscillator which can obtain a MEMS vibrator having a resonant frequency within a target accuracy with high yield even when variation in resonant frequency caused by variation in the film thickness of the MEMS vibrator is great compared to the target accuracy required as a product, and a method of manufacturing thereof.

A first aspect of the invention is directed to a MEMS oscillator including: a plurality of MEMS vibrators formed on a substrate; and an oscillator configuration circuit electrically connected to the plurality of MEMS vibrators for performing an oscillation operation, wherein the plurality of MEMS vibrators each have a beam structure, and the respective beam structures of the plurality of MEMS vibrators are different, whereby their resonant frequencies are different.

According to the MEMS oscillator, it is possible to provide a MEMS oscillator which can obtain a MEMS vibrator having a resonant frequency within a target accuracy with high yield even when variation in resonant frequency caused by variation in the film thickness of the MEMS vibrator is great compared to the target accuracy required as a product.

In the MEMS oscillator according to the first aspect of the invention, it is preferable that the oscillator configuration circuit includes a selecting section connected to the plurality of MEMS vibrators, a bias voltage applying section for selectively applying a bias voltage to any one of the plurality of MEMS vibrators with the selecting section, an oscillator circuit section for performing an oscillation operation using the one MEMS vibrator to which the bias voltage is applied, and a buffer section connected to the oscillator circuit section and outputting oscillation output, and that the selecting section does not apply the bias voltage to all the other MEMS vibrators than the one MEMS vibrator among the plurality of MEMS vibrators.

In the MEMS oscillator according to the first aspect of the invention, it is preferable that the selecting section is connected to the bias voltage applying section and the oscillator circuit section, electrically connects selectively the one MEMS vibrator to the oscillator circuit section, and does not electrically connect all the other MEMS vibrators than the one MEMS vibrator among the plurality of MEMS vibrators to the oscillator circuit section.

In the MEMS oscillator according to the first aspect of the invention, it is preferable that the selecting section is connected to the bias voltage applying section and the oscillator circuit section, and that the oscillator circuit section is connected to the plurality of MEMS vibrators.

In the MEMS oscillator according to the first aspect of the invention, it is preferable that the oscillator configuration circuit includes a bias voltage applying and selecting section for selectively applying a bias voltage to any one of the plurality of MEMS vibrators, an oscillator circuit section for performing an oscillation operation using the one MEMS vibrator to which the bias voltage is applied, and a buffer section connected to the oscillator circuit section and outputting oscillation output, and that the bias voltage applying and selecting section does not apply the bias voltage to all the other MEMS vibrators than the one MEMS vibrator among the plurality of MEMS vibrators.

In the MEMS oscillator according to the first aspect of the invention, it is preferable that in the selecting section in its initial state, any one of the plurality of MEMS vibrators has been selected, and the other MEMS vibrators than the one MEMS vibrator have not been selected, that any of the MEMS vibrators other than the one MEMS vibrator can be selected with adjustment work of the MEMS oscillator, and that the selectivity of the selecting section is irreversible.

In the MEMS oscillator according to the first aspect of the invention, it is preferable that in the selecting section in its initial state, any one of the plurality of MEMS vibrators has been selected, and the other MEMS vibrators than the one MEMS vibrator have not been selected, that any of the MEMS vibrators other than the one MEMS vibrator can be selected with adjustment work of the MEMS oscillator, and that the selectivity of the selecting section is reversible.

In the MEMS oscillator according to the first aspect of the invention, it is preferable that the beam structure has a fixed electrode formed on the substrate and a movable electrode including a beam provided to face the fixed electrode and capable of vibrating, and that the difference in the beam structure means the difference in length of the beam.

In the MEMS oscillator according to the first aspect of the invention, it is preferable that the resonant frequencies of the plurality of MEMS vibrators are equally spaced apart.

A second aspect of the invention is directed to a method of manufacturing a MEMS oscillator, including: forming, on a substrate, a plurality of MEMS vibrators having a predetermined resonant frequency difference in design value, a selecting section to which the plurality of MEMS vibrators are connected, a bias voltage applying section and an oscillator circuit section both connected to the selecting section, and a buffer section connected to the oscillator circuit section; selectively applying a bias voltage to any one of the plurality of MEMS vibrators by the selecting section and the bias voltage applying section, causing the one MEMS vibrator to oscillate by the oscillator circuit section, measuring a resonant frequency oscillation-output from the one MEMS vibrator by the buffer section, specifying one MEMS vibrator having a resonant frequency within a predetermined range from the plurality of MEMS vibrators; and not selecting all the not-specified MEMS vibrators by the selecting section, and selecting the specified one MEMS vibrator by the selecting section, thereby not to electrically connect all the not-specified MEMS vibrators to the oscillator circuit section, and to electrically connect the specified one MEMS vibrator to the oscillator circuit section by the selecting section, wherein the plurality of MEMS vibrators each have a beam structure, and the respective beam structures of the plurality of MEMS vibrators are different, whereby the plurality of MEMS vibrators have the predetermined resonant frequency difference.

In the method of manufacturing the MEMS oscillator according to the second aspect of the invention, it is preferable that the selecting section has a switching portion switching the MEMS vibrator between selection and non-selection, and that a fuse is used for the switching portion.

In the method of manufacturing the MEMS oscillator according to the second aspect of the invention, it is preferable that the selecting section has a switching portion switching the MEMS vibrator between selection and non-selection, and that a semiconductor memory is used for the switching portion.

BRIEF DESCRIPTION OF THE DRAWINGS

The invention will be described with reference to the accompanying drawings, wherein like numbers reference like elements.

FIGS. 6A to 6C are cross-sectional views explaining a method of manufacturing the MEMS vibrator shown in FIG. 2.

FIGS. 7A to 7C are cross-sectional views explaining the method of manufacturing the MEMS vibrator shown in FIG. 2.

FIG. 15 is a perspective view showing an exemplary MEMS vibrator using a cantilever structure.

FIG. 16A is a plan view of the MEMS vibrator shown in FIG. 15; FIG. 16B is a cross-sectional view taken along line B-B' shown in FIG. 16A; and FIG. 16C is a cross-sectional view taken along line C-C' shown in FIG. 16A.

DESCRIPTION OF EXEMPLARY EMBODIMENTS

Hereinafter, embodiments of the invention will be descried in detail with reference to the drawings. However, the invention is not limited to the following description, and those skilled in the art should readily appreciate that the embodiments and details of the invention can be modified variously without departing from the gist and scope of the invention. Accordingly, the invention should not be construed to be limited to the description of the embodiments shown below.

First Embodiment

Figure 1:
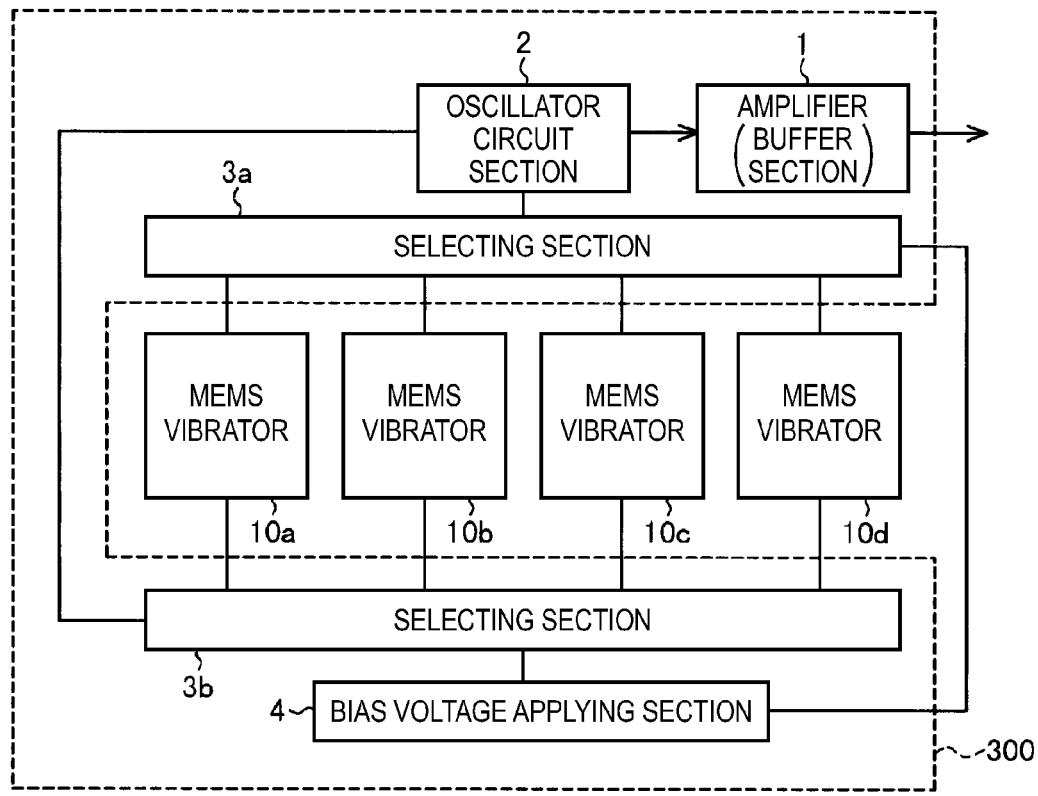
FIG. 1 is a block diagram schematically showing a MEMS oscillator according to a first embodiment.

FIG. 1 is a block diagram schematically showing a MEMS oscillator according to a first embodiment. The MEMS oscillator has an oscillator configuration circuit 300 and a plurality of MEMS vibrators, for example, four MEMS vibrators 10a to 10d. The oscillator configuration circuit 300 has an amplifier (buffer section) 1, an oscillator circuit section 2, selecting sections 3a and 3b, and a bias voltage applying section 4. The oscillator circuit section 2 has circuit elements, active circuit portions such as transistors, an output terminal, and the like.

One electrode of each of the four MEMS vibrators 10a to 10d is electrically connected to the oscillator circuit section 2 via the selecting section 3a, while the other electrode of each of the four MEMS vibrators 10a to 10d is electrically connected to the oscillator circuit section 2 via the selecting section 3b. The oscillator circuit section 2 is electrically connected to the amplifier 1.

The bias voltage applying section 4 is connected to the selecting sections 3a and 3b. The bias voltage applying section 4 applies a DC bias voltage to each of the four MEMS vibrators 10a to 10d, or only selected one MEMS vibrator via the selecting sections 3a and 3b.

The four MEMS vibrators 10a to 10d each have a beam structure. The respective beam structures of the four MEMS vibrators 10a to 10d are different, whereby their resonant frequencies are different to provide a predetermined resonant frequency difference.

Figure 2:
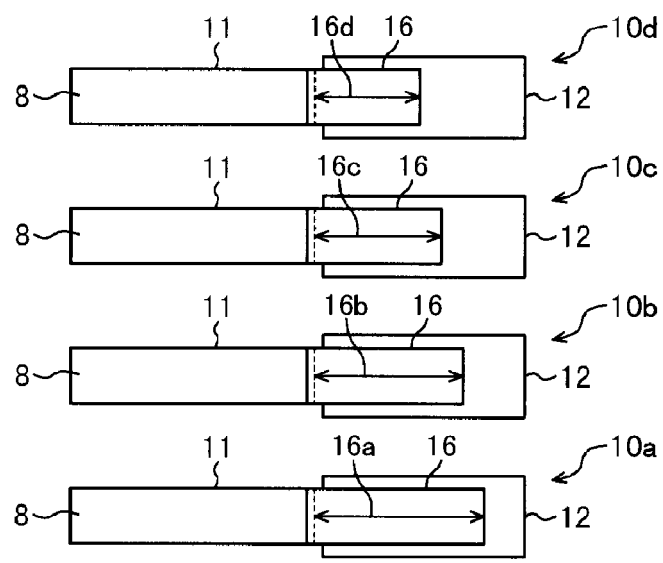
FIG. 2 is a plan view showing four MEMS vibrators shown in FIG. 1.

FIG. 2 is a plan view showing the four MEMS vibrators 10a to 10d shown in FIG. 1. Each of the MEMS vibrators 10a to 10d has the same structure as that of the MEMS vibrator shown in FIGS. 16A to 16C. However, beam lengths 16a to 16d are changed, whereby their resonant frequencies are different.

Specifically, each of the MEMS vibrators 10a to 10d is composed of a fixed electrode 12 formed on a not-shown substrate and a movable electrode 8 formed apart from the fixed electrode 12 with a constant gap. The movable electrode 8 is composed of a fixed portion 11 formed on the substrate, a movable portion (beam) 16 provided to face the fixed electrode 12 and capable of vibrating, and a supporting portion coupling the movable portion 16 with the fixed portion 11 and supporting them. The MEMS vibrators are formed such that the beam lengths 16a to 16d become shorter in the order from the MEMS vibrator 10a to the MEMS vibrator 10d. The beam length 16a of the MEMS vibrator 10a is longest, and the beam length 16b of the MEMS vibrator 10b, the beam length 16c of the MEMS vibrator 10c, and the beam length 16d of the MEMS vibrator 10d progressively become shorter in this order.

Figure 3:
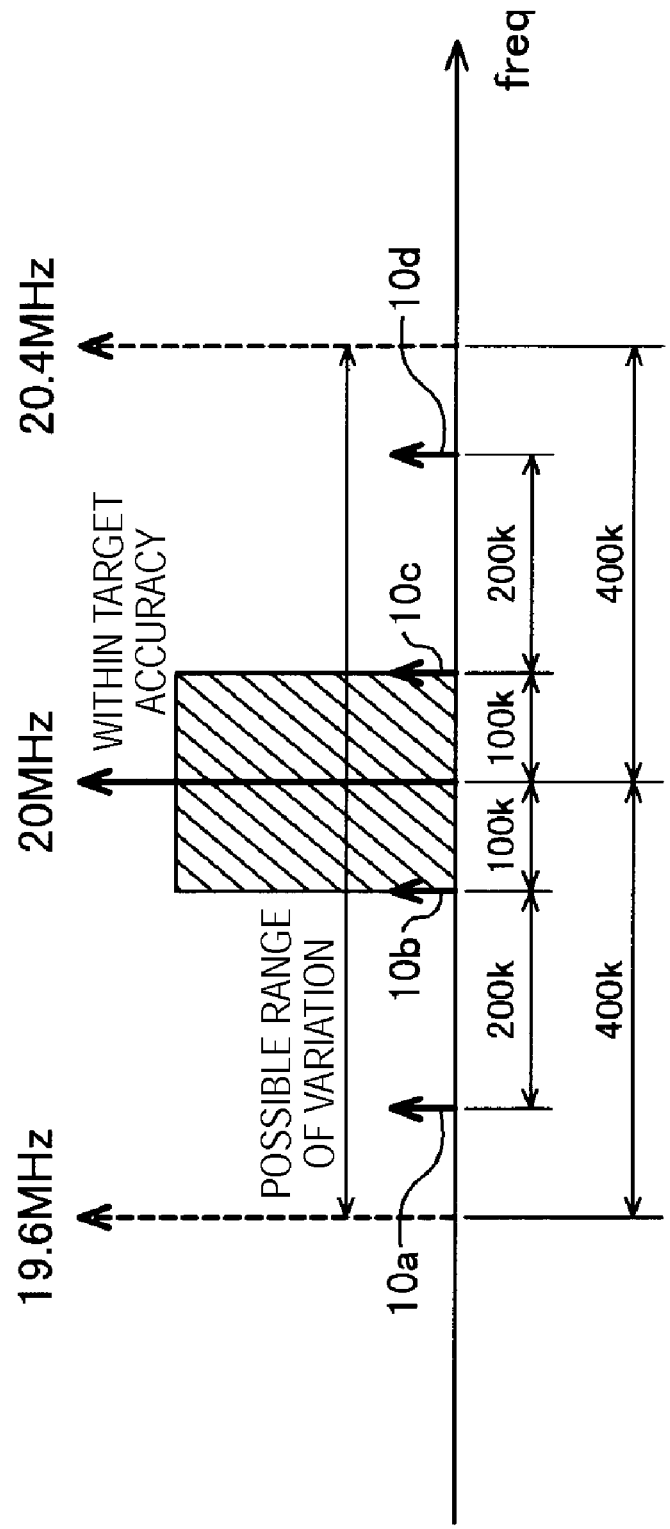
FIG. 3 shows the relation between variation in resonant frequency and target accuracy (tolerance) of a MEMS vibrator and design values of the resonant frequencies of the four MEMS vibrators shown in FIG. 2.
Figure 17:
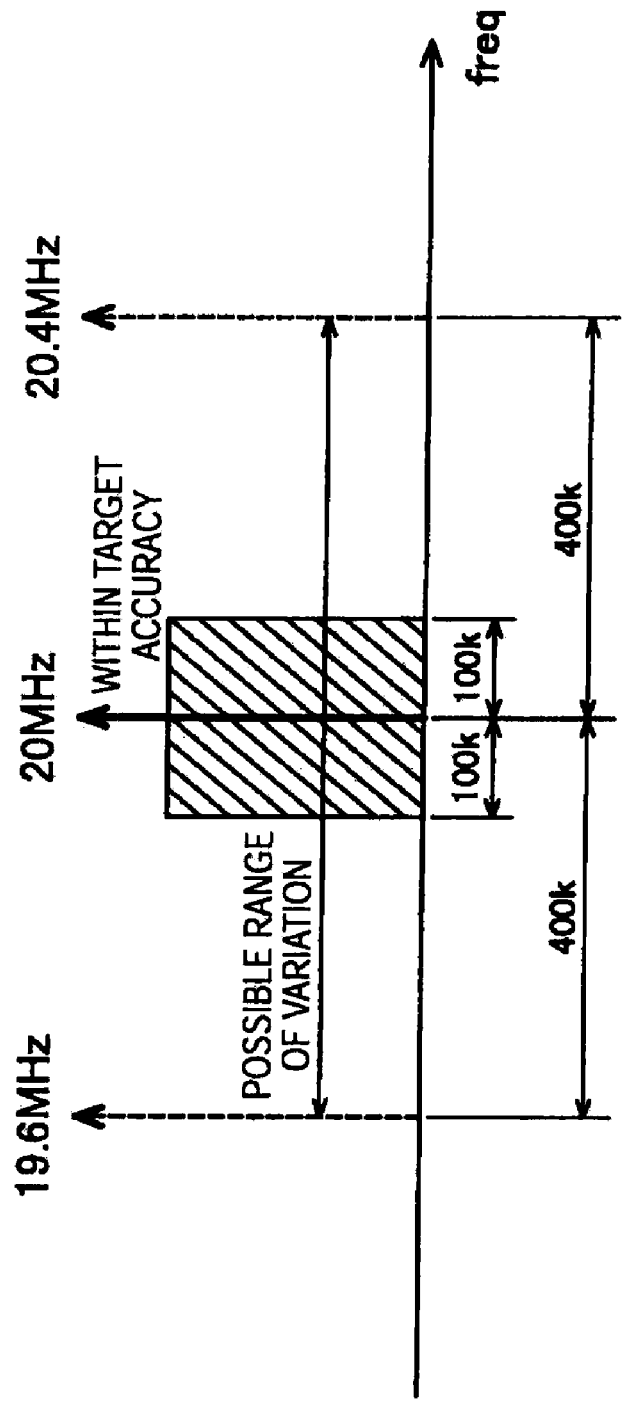
FIG. 17 shows the relation between variation in resonant frequency caused by variation in the film thickness of a fixed electrode and a movable electrode of a MEMS vibrator and target accuracy required for the MEMS vibrator.

FIG. 3 is a diagram representing design values of respective resonant frequencies of the four MEMS vibrators 10a to 10d shown in FIG. 2, in the diagram of FIG. 17 showing the relation between the variation in resonant frequency and target accuracy (tolerance) of a MEMS vibrator.

For the MEMS oscillator shown in FIG. 1, an oscillator which oscillates at a resonant frequency of 20 MHz±0.5% (±100 kHz) will be described as an example. Since the specific numerical value of resonant frequency and the specific numerical value of target accuracy described in the embodiment vary depending on products, they are illustrative only.

As shown in FIG. 3, the MEMS vibrator 10a has a design value of 19.7 MHz; the MEMS vibrator 10b has a design value of 19.9 MHz; the MEMS vibrator 10c has a design value of 20.1 MHz; and the MEMS vibrator 10d has a design value of 20.3 MHz. In other words, each of the beam lengths 16a to 16d shown in FIG. 2 is extended or shortened by the amount of a required frequency so that the MEMS vibrators 10a to 10d respectively have the above-described design values. Since an equation for deriving a resonant frequency fr is the following equation (1), the resonant frequency fr can be changed by extending or shortening the beam length.

$$fr = (35E/33\rho)^{1/2} H/(2\pi L^2) \tag{1}$$

where H and L are respectively the film thickness and beam length of the MEMS vibrator; and E and ρ are respectively the Young's modulus and density of a material constituting the MEMS vibrator.

When the target accuracy required as a product is ±0.5% (±100 kHz), and the variation in resonant frequency caused by the variation in the film thickness of the beam is ±2% (±400 kHz), the MEMS vibrators 10a to 10d of four design values spaced at 200 kHz intervals are manufactured on the substrate as shown in FIG. 2 by differentiating the beam structures (for example, beam lengths). Thus, even when variation in the film thickness (that is, the variation in the film thickness of the fixed electrode 12 and the movable electrode 8 shown in FIG. 2) of the beam occurs in the plane of a substrate or from substrate to substrate in mass-produced MEMS vibrators, at least one MEMS vibrator among the four MEMS vibrators 10a to 10d reliably has a resonant frequency within the target accuracy of 20 MHz±0.5% (±100 kHz). The reason is as follows.

Even when the variation in the film thickness of the beam occurs in the plane of a substrate or from substrate to substrate, and all resonant frequencies of the four MEMS vibrators 10a to 10d are each shifted by +400 kHz from its design value, actual resonant frequencies of the four manufactured MEMS vibrators 10a to 10d are 20.1 MHz, 20.3 MHz, 20.5 MHz, and 20.7 MHz, respectively. Accordingly, one MEMS vibrator 10a among the four MEMS vibrators has a resonant frequency within the target accuracy.

Moreover, even when the variation in the film thickness of the beam occurs in the plane of a substrate or from substrate to substrate, and all resonant frequencies of the four MEMS vibrators 10a to 10d are each shifted by −400 kHz from its design value, actual resonant frequencies of the four manufactured MEMS vibrators 10a to 10d are 19.3 MHz, 19.5 MHz, 19.7 MHz, and 19.9 MHz, respectively. Accordingly, one MEMS vibrator 10d among the four MEMS vibrators has a resonant frequency within the target accuracy.

In the embodiment as described above, since it is intended that the difference in resonant frequency will be 200 kHz between the respective MEMS vibrators 10a to 10d, it is preferable to reduce variation in the difference due to variation in manufacturing process. As shown in FIG. 2, therefore, the MEMS vibrators 10a to 10d are preferably formed close to one another and are preferably formed such that the length directions of the beams 16 are in the same direction.

In the embodiment, since the variation in resonant frequency (±400 kHz) caused by the variation in the film thickness of the beam is four times the target accuracy (±100 kHz) required as a product, at least four MEMS vibrators have to be manufactured on a substrate. The difference between each of design values of the four MEMS vibrators and its closest design value has to be within the target accuracy range (200 kHz or less).

When the above content is represented by a general expression in which the variation in resonant frequency caused by the variation in the film thickness of the beam is ±X (kHz) and the target accuracy required as a product is ±Y (kHz), at least X/Y MEMS vibrators have to be manufactured on a substrate. The difference between each of design values of the X/Y MEMS vibrators and its closest design value has to be 2Y or less.

In the MEMS oscillator shown in FIG. 1 as described above, the four MEMS vibrators 10a to 10d are manufactured. However, when the variation in resonant frequency caused by the variation in the film thickness of the beam and the target accuracy are changed, X/Y MEMS vibrators are to be manufactured.

Figure 4:
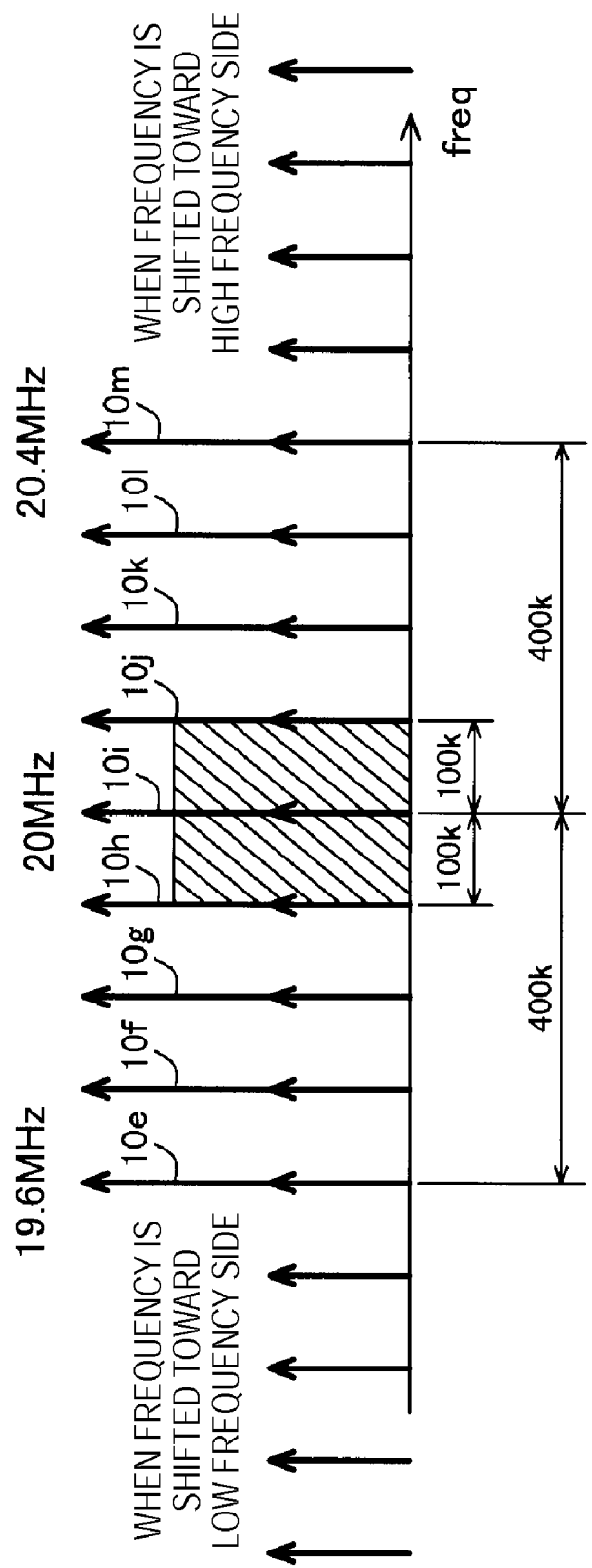
FIG. 4 shows the relation between variation in resonant frequency and target accuracy (tolerance) of the MEMS vibrator and design values of the resonant frequencies of nine MEMS vibrators.

In the embodiment as shown in FIG. 3, the difference in resonant frequency is set to 200 kHz, and the MEMS oscillator having the four MEMS vibrators 10a to 10d is formed. However, this is not restrictive. As shown in FIG. 4, the difference in resonant frequency may be set to 100 kHz, and a MEMS oscillator having nine MEMS vibrators 10e to 10m may be formed. Thus, two MEMS vibrators among the nine MEMS vibrators 10e to 10m each have a resonant frequency within the target accuracy.

In the embodiment as shown in FIGS. 1 to 3, the difference in resonant frequency is set to 200 kHz, the MEMS oscillator having the four MEMS vibrators 10a to 10d is cited as an example, and a case where the variation in the film thickness of the beam occurs and all resonant frequencies of the four MEMS vibrators 10a to 10d are each shifted by +200 kHz to +400 kHz from its design value will be described. In this case, after the MEMS vibrators are manufactured, one MEMS vibrator 10a within the target accuracy range is selected by the selecting sections 3a and 3b, whereby the MEMS vibrator 10a is connected to the oscillator circuit section 2; and all the other MEMS vibrators 10b to 10d beyond the target accuracy range than one MEMS vibrator 10a are not selected by the selecting sections 3a and 3b, whereby the MEMS vibrators 10b to 10d are not connected to the oscillator circuit section 2. As a result, one MEMS vibrator 10a within the target accuracy range among the four MEMS vibrators 10a to 10d is electrically connected to the oscillator circuit section 2, and all the other MEMS vibrators 10b to 10d beyond the target accuracy range than one MEMS vibrator 10a among the four MEMS vibrators 10a to 10d are not electrically connected.

The selection and non-selection of the MEMS vibrators by the selecting sections 3a and 3b as described above are performed when the MEMS oscillator in FIG. 1 is manufactured. After performing the selection and non-selection, it is impossible to perform the selection and non-selection of the MEMS vibrators by the selecting sections 3a and 3b.

Figure 5:
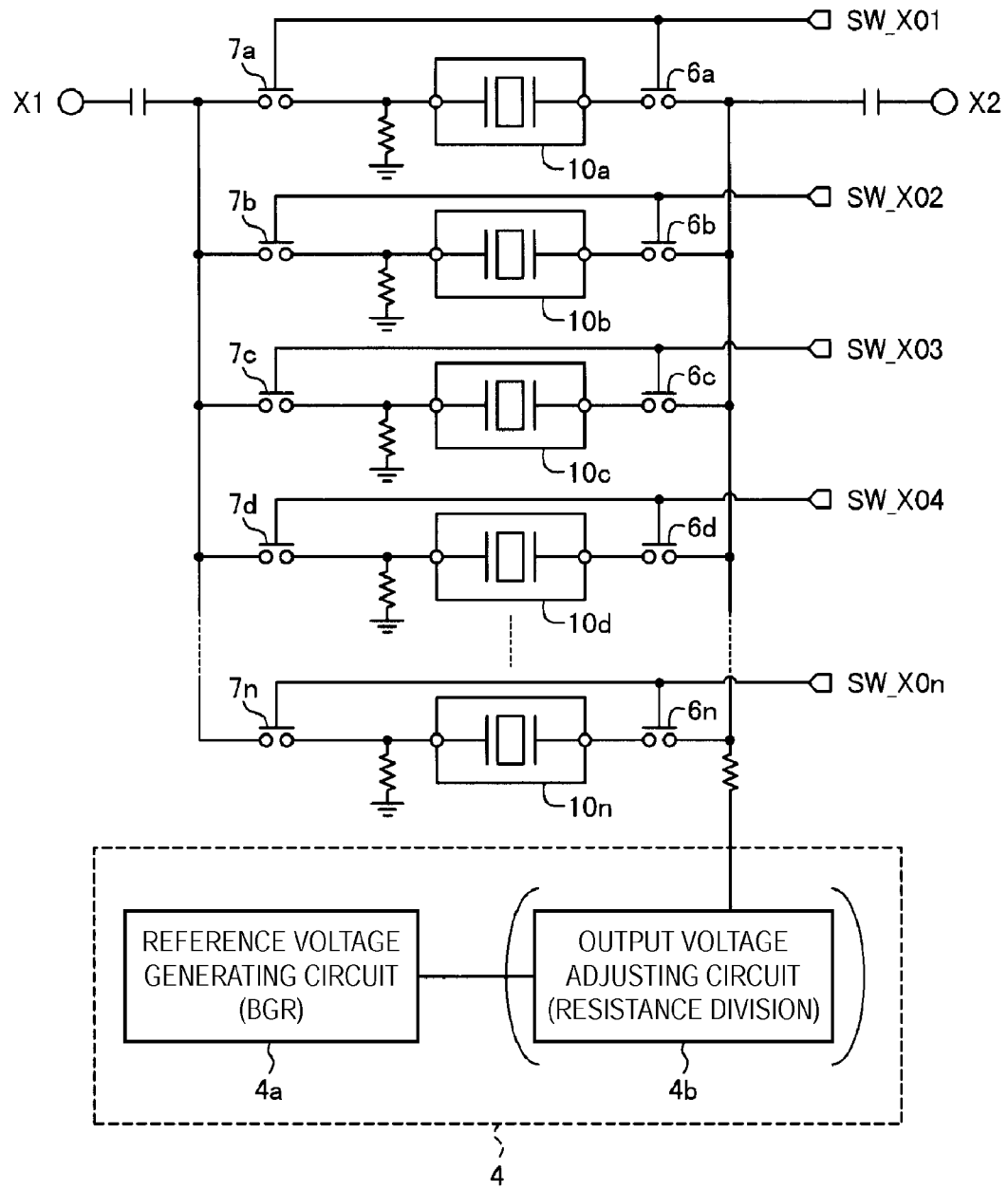
FIG. 5 is a circuit diagram for explaining selecting sections shown in FIG. 1 in detail.

FIG. 5 is a circuit diagram for explaining the selecting sections 3a and 3b shown in FIG. 1 in detail. A reference voltage generating circuit (BGR) 4a and an output voltage adjusting circuit 4b shown in FIG. 5 correspond to the bias voltage applying section 4 shown in FIG. 1. The bias voltage applying section 4 is electrically connected to a plurality of MEMS vibrators 10a, 10b, 10c, 10d, . . . , and 10n via the selecting sections 3a and 3b. Different from FIG. 1, four or more MEMS vibrators are formed in FIG. 5. However, the minimum number of MEMS vibrators is changed depending on the variation in resonant frequency caused by the variation in the film thickness of the beam and the target accuracy, and the number of MEMS vibrators is not restrictive. The output voltage adjusting circuit 4b is a circuit which finely adjusts a resonant frequency. However, when the fine adjustment of the frequency is not necessary, the output voltage adjusting circuit 4b may be omitted.

The selecting sections 3a and 3b shown in FIG. 1 have analog switches 6a to 6n respectively connected between one electrode of each of the MEMS vibrators 10a to 10n and a terminal X2 shown in FIG. 5; analog switches 7a to 7n respectively connected between the other electrode of each of the MEMS vibrators 10a to 10n and a terminal X1; input portions SW_X01 to SW_X0n which input a high signal and a low signal respectively for bringing the analog switch into an on state and an off state; and fuse elements (not shown) for switching the signal input from the input portion to the analog switches from high to low or from low to high. The terminals X1 and X2 are electrically connected to the oscillator circuit section 2 shown in FIG. 1.

There are two types of the analog switch. The one is an analog switch which is, when a high signal is input thereto from the input portion, brought into the on state to thereby establish a conductive state between the MEMS vibrator and the oscillator circuit section, while the analog switch is, when a low signal is input thereto from the input portion by cutting the fuse, brought into the off state to thereby establish a non-conductive state between the MEMS vibrator and the oscillator circuit section. The other is an analog switch which is, when a low signal is input thereto from the input portion, brought into the off state to thereby establish the non-conductive state between the MEMS vibrator and the oscillator circuit section, while the analog switch is, when a high signal is input thereto from the input portion by cutting the fuse, brought into the on state to thereby establish the conductive state between the MEMS vibrator and the oscillator circuit section.

Although a fuse without reversibility is used as state switching means for the analog switch in the example, this is not restrictive. As a substitute, switching means having electrical reversibility, in which high and low levels of the control signal of the analog switch are held or switched by a semiconductor memory, for example, may be used. In short, any means may be used as long as it switches the analog switch to a desired operation state and holds the state.

Next, a method of manufacturing the MEMS oscillator shown in FIG. 1 will be described with reference to FIGS. 6A to 9.

FIGS. 6A to 8D are cross-sectional views explaining a method of manufacturing the MEMS vibrator shown in FIG. 2.

Figure 9:
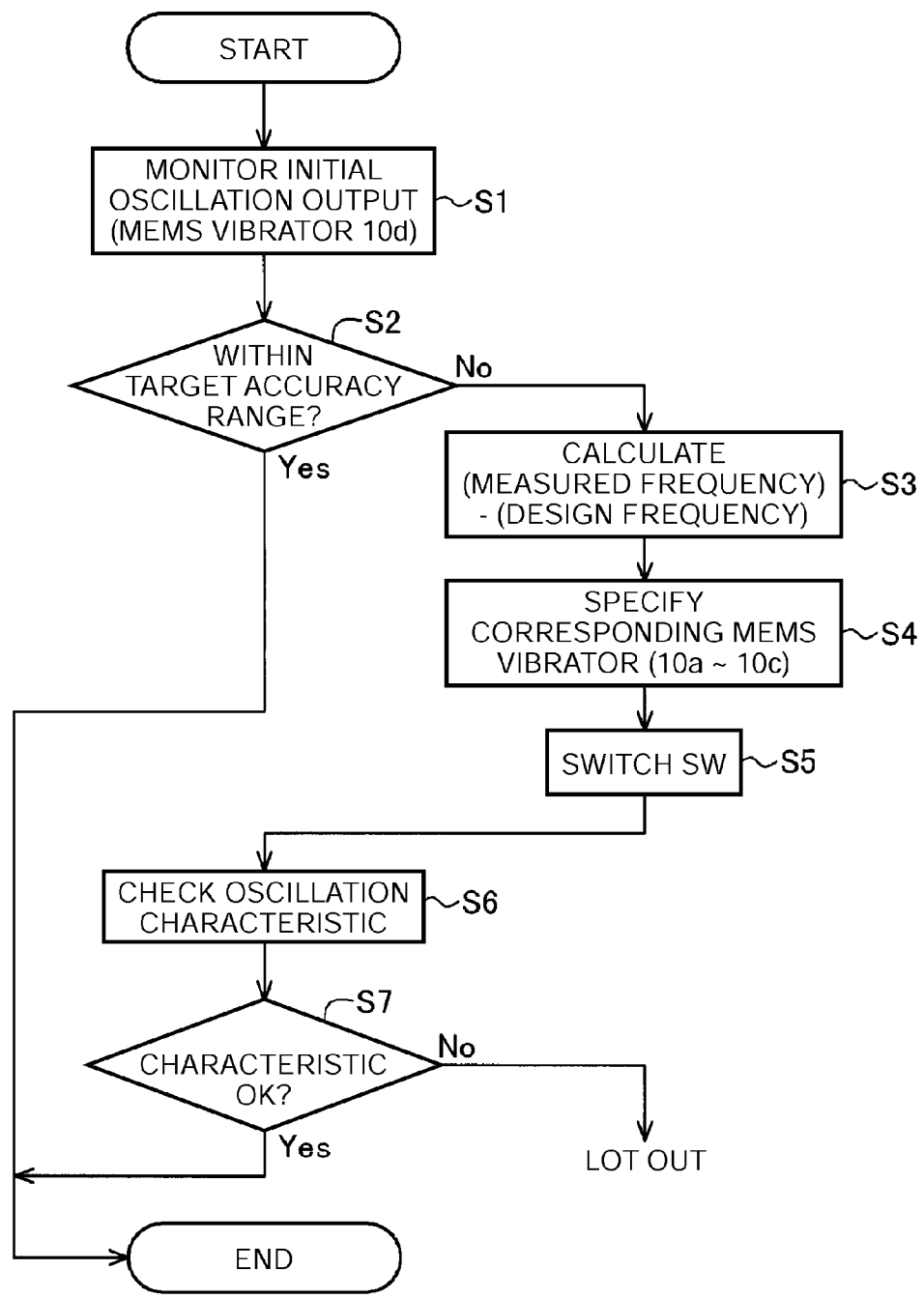
FIG. 9 is a flowchart explaining a method of performing selection and non-selection of the MEMS vibrators by the selecting sections shown in FIG. 1.

FIG. 9 is a flowchart explaining a method of performing the selection and non-selection of the MEMS vibrators by the selecting sections shown in FIG. 1.

As shown in FIG. 6A, a p-type Si substrate 15 is prepared. Next as shown in FIG. 6B, a silicon oxide film 14 is formed on the p-type Si substrate 15. Next as shown in FIG. 6C, a silicon nitride film 13 is formed on the silicon oxide film 14.

Next as shown in FIG. 7A, a first layer polysilicon film is deposited on the silicon nitride film 13 by a CVD method. Next, a resist film (not shown) is coated on the polysilicon film, and the resist film is exposed and developed to form a resist pattern on the polysilicon film. Next, the first layer polysilicon film is etched using the resist pattern as a mask to form the fixed electrode 12 formed of the first layer polysilicon film on the silicon nitride film 13.

Next as shown in FIG. 7B, a silicon oxide film (sacrificial layer) 20 is formed so as to cover the surface of the fixed electrode 12. Next as shown in FIG. 7C, a second layer polysilicon film is deposited on the silicon nitride film 13 and the silicon oxide film 20 by a CVD method. Next, a resist film (not shown) is coated on the polysilicon film, and the resist film is exposed and developed to form a resist pattern on the polysilicon film. Next, the second layer polysilicon film is etched using the resist pattern as a mask to form the movable electrode 8 formed of the second layer polysilicon film on the silicon nitride film 13.

Figure 8A:
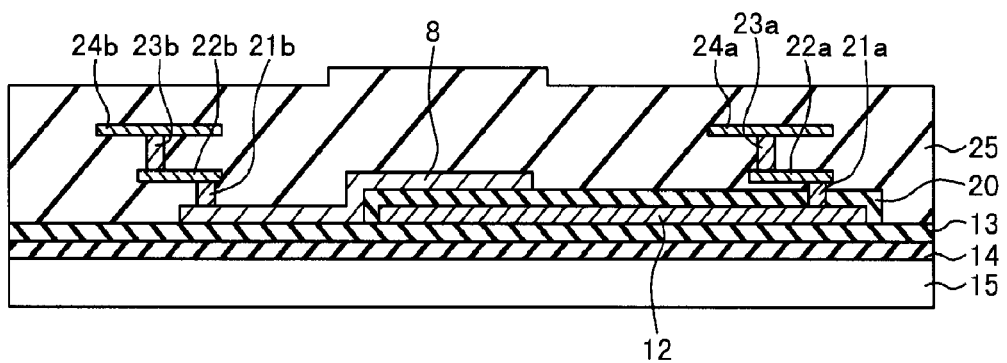
FIGS. 8A to 8D are cross-sectional views explaining the method of manufacturing the MEMS vibrator shown in FIG. 2.

Next as shown in FIG. 8A, an inter-layer insulating film 25 having a multi-layer wiring therein is formed on the movable electrode 8 and the fixed electrode 12. The multi-layer wiring has a first wiring plug 21a electrically connected to the fixed electrode 12; a first wiring 22a electrically connected on the first wiring plug 21a; a second wiring plug 23a electrically connected on the first wiring 22a; and a second wiring 24a electrically connected on the second wiring plug 23a. In addition, the multi-layer wiring has a first wiring plug 21b electrically connected to the movable electrode 8; a first wiring 22b electrically connected on the first wiring plug 21b; a second wiring plug 23b electrically connected on the first wiring 22b; and a second wiring 24b electrically connected on the second wiring plug 23b. The second wirings 24a and 24b are respectively connected to the selecting sections 3a and 3b shown in FIG. 1.

Figure 8B:
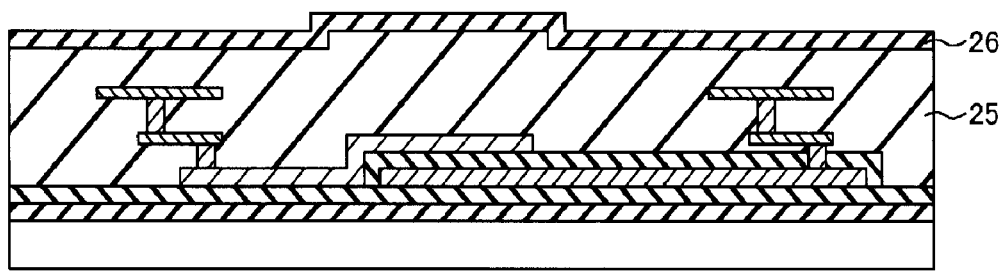
Figure 8C:
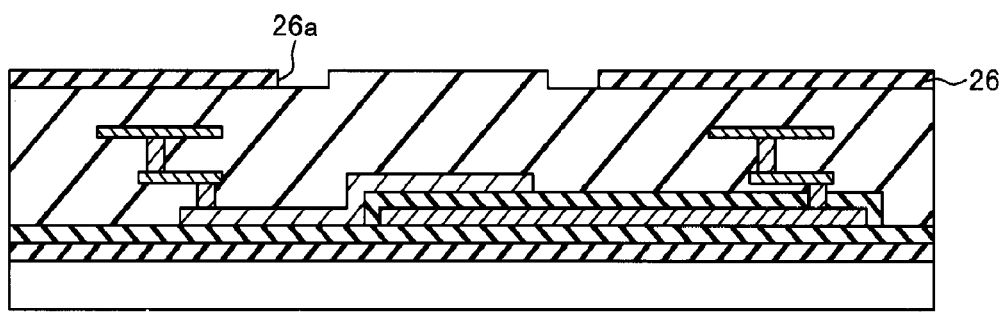

Next as shown in FIG. 8B, a passivation film 26 is formed on the inter-layer insulating film 25. Next as shown in FIG. 8C, the passivation film 26 is etched to form an opening 26a through the passivation film 26.

Figure 8D:
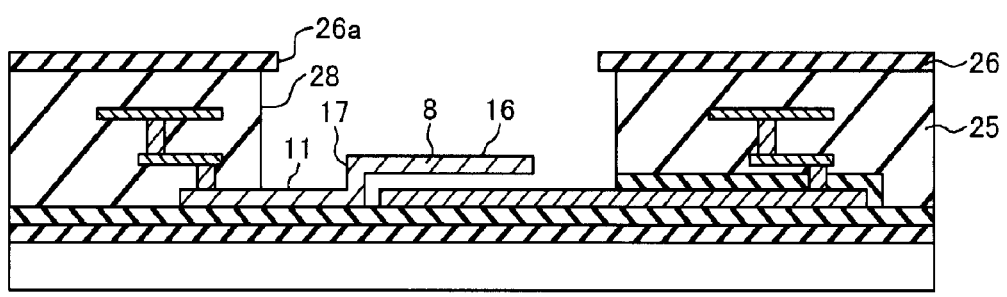

Next as shown in FIG. 8D, wet etching is performed using the passivation film 26 as a mask to remove the inter-layer insulating film 25 and the silicon oxide film 20 positioned below the opening 26a. Thus, a cavity 28 is formed in the inter-layer insulating film 25, and a MEMS vibrator is formed in the cavity 28. The MEMS vibrator is composed of the fixed electrode 12 and the movable electrode 8 formed apart from the fixed electrode 12 with a constant gap. The movable electrode 8 is composed of the fixed portion 11, the movable portion (beam) 16 provided to face the fixed electrode 12 and capable of vibrating, and a supporting portion 17 coupling the movable portion 16 with the fixed portion 11 and supporting them.

Although only one MEMS vibrator is shown in FIG. 8D, four MEMS vibrators may be disposed in parallel in the cavity 28 as shown in FIG. 2. Alternatively, four cavities 28 may be disposed in parallel, and one MEMS vibrator may be disposed in each of the four cavities.

Thereafter, a lid (not shown) is formed above the cavity 28, so that the MEMS vibrators 10a to 10d are sealed in the cavity 28 under reduced pressure and sealed in a package.

By using the semiconductor process for forming the MEMS vibrator on the p-type Si substrate 15 as described above, any of or all of the analog switches 6a to 6n and 7a to 7n and the input portions SW_X01 to SW_X0n shown in FIG. 5, the fuse elements, and the oscillator circuit section 2, the bias voltage applying section 4, and the amplifier 1 shown in FIG. 1 may be formed simultaneously or separately, in the other region of the p-type Si substrate 15. The analog switch may use a semiconductor switch or a mechanical switch.

In an initial state where the MEMS oscillator shown in FIG. 1 is manufactured as described above, the analog switches shown in FIG. 5 are in the following state. The initial state means a state where the fuse is not cut.

When a high signal is input from the input portion to the analog switches respectively connected between one electrode and the other electrode of the MEMS vibrator 10d and the oscillator circuit section 2, the analog switches are brought into the on state to thereby establish the conductive state between the MEMS vibrator 10d and the oscillator circuit section 2. Moreover, when a low signal is input from the input portion to the analog switches respectively connected between one electrode and the other electrode of each of the MEMS vibrators 10a to 10c and the oscillator circuit section 2, the analog switches are brought into the off state to thereby establish the non-conductive state between each of the MEMS vibrators 10a to 10c and the oscillator circuit section 2.

Next, a method of performing the selection and non-selection of the MEMS vibrators by the selecting sections 3a and 3b shown in FIG. 1 will be described with reference to FIG. 9.

First as shown in FIG. 9, a high signal is input from the input portion through the fuse to the analog switches respectively connected between one electrode and the other electrode of the MEMS vibrator 10d and the oscillator circuit section 2, so that the MEMS vibrator 10d is electrically connected to the oscillator circuit section 2; and a low signal is input from the input portion through the fuse to the analog switches respectively connected between one electrode and the other electrode of each of the MEMS vibrators 10a to 10c and the oscillator circuit section 2, so that the MEMS vibrators 10a to 10c are not electrically connected to the oscillator circuit section 2. In this state, the MEMS vibrator 10d is caused to oscillate by the oscillator circuit section 2, and a resonant frequency output from the MEMS vibrator 10d is measured (S1). It is determined whether or not the measured resonant frequency is within the target accuracy range shown in FIG. 3 (S2).

If the determined result is within the target accuracy range shown in FIG. 3, the process ends without switching the switches of the selecting sections.

If the measured result of the resonant frequency is 20.55 MHz for example, it is determined that the measured resonant frequency is not within the target accuracy range (S2). In this case, the difference (250 kHz) between the measured resonant frequency (20.55 MHz) and the design value (20.3 MHz) of the resonant frequency of the MEMS vibrator 10d measured is calculated (S3). By using the calculated difference (250 kHz), the resonant frequency difference (200 kHz) in design value between the respective MEMS vibrators 10a to 10d, and the design values (19.7 MHz, 19.9 MHz, 20.1 MHz, and 20.3 MHz shown in FIG. 3) of the resonant frequencies of the MEMS vibrators 10a to 10d, it is specified which of the MEMS vibrators 10a to 10c has a resonant frequency within the target accuracy range (S4). Specifically, since the difference is 250 kHz, it is presumed that the MEMS vibrator 10a has an actual resonant frequency of 19.95 MHz, that the MEMS vibrator 10b has an actual resonant frequency of 20.15 MHz, and that the MEMS vibrator 10c has an actual resonant frequency of 20.35 MHz. Based on these presumed results, it is specified that the MEMS vibrator 10a has a resonant frequency within the target accuracy range (S4).

Next, all the not-specified MEMS vibrators 10b to 10d are not selected by the selecting sections 3a and 3b, and the specified one MEMS vibrator 10a is selected by the selecting sections 3a and 3b, whereby all the not-specified MEMS vibrators 10b to 10d are not electrically connected to the oscillator circuit section 2, and the specified one MEMS vibrator 10a is electrically connected to the oscillator circuit section 2 by the selecting sections 3a and 3b (S5).

Specifically, by cutting the fuse to be used when a high signal is input to the analog switches connected to the MEMS vibrator 10d, a low signal is input from the input portion to the analog switches connected to the MEMS vibrator 10d. As a result, the non-conductive state is established between the MEMS vibrator 10d and the oscillator circuit section 2. Since the non-conductive state is established between the MEMS vibrators 10b and 10c and the oscillator circuit section 2 in the initial state, it is possible not to electrically connect all the not-specified MEMS vibrators 10b to 10d to the oscillator circuit section 2. By cutting the fuse to be used when a low signal is input to the analog switches connected to the MEMS vibrator 10a, a high signal is input from the input portion to the analog switches connected to the MEMS vibrator 10a. As a result, the conductive state is established between the MEMS vibrator 10a and the oscillator circuit section 2, so that the specified one MEMS vibrator 10a and the oscillator circuit section can be electrically connected to each other.

Thereafter, the MEMS vibrator 10a is caused to oscillate by the oscillator circuit section 2, and the oscillation characteristic of the MEMS vibrator 10a is checked (S6). It is determined whether the oscillation characteristic is good or bad (S7). If the determined result is good, the process ends. If the determined result is bad, the lot is rejected.

Next, a post-process such as a dicing process for cutting into chips is applied.

As described above, even when the variation in resonant frequency caused by the variation in the film thickness of the beam is great compared to the target accuracy required as a product, a MEMS vibrator having a resonant frequency within the target accuracy can be reliably selected. Accordingly, it is possible to obtain a MEMS oscillator with high yield.

In the embodiment, the MEMS vibrators 10a to 10d using the cantilever structure shown in FIG. 2 are used. However, the embodiment can also be implemented by modifying the MEMS vibrator using the cantilever structure into a MEMS vibrator using a clamped-clamped structure described below.

First Modified Example

Figure 10A:
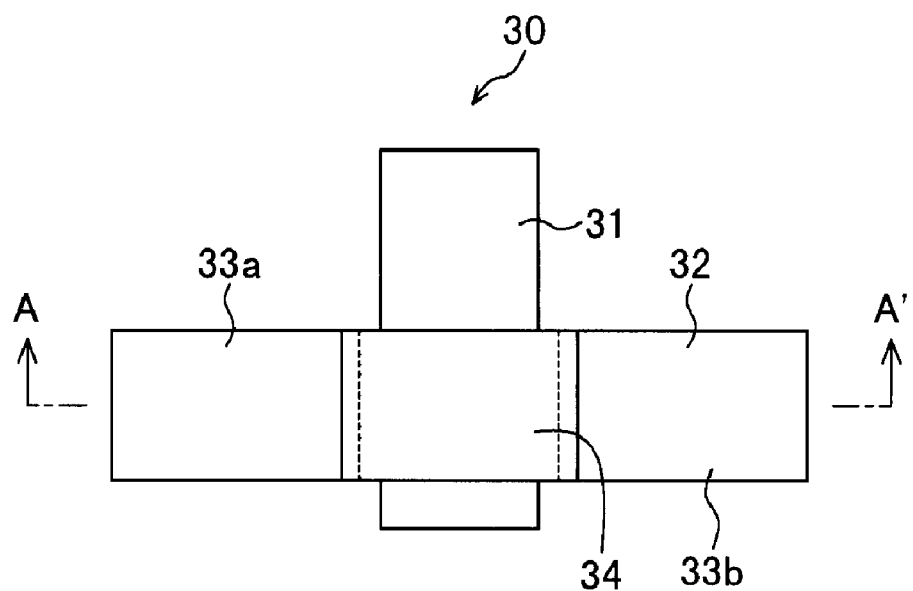
FIG. 10A is a plan view showing the basic structure of a MEMS vibrator using a clamped-clamped structure.
Figure 10B:
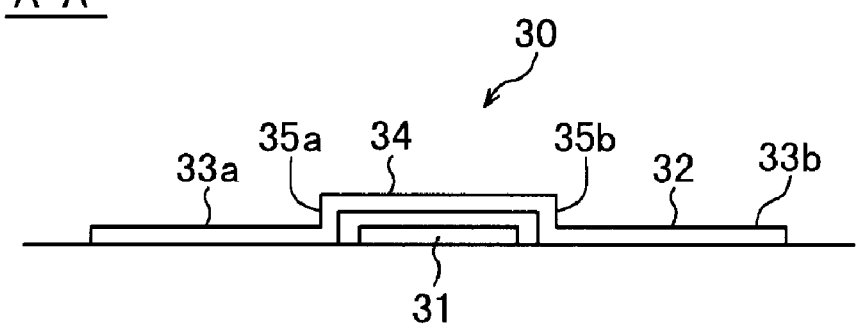
FIG. 10B is a side view taken along line A-A' shown in FIG. 10A.
Figure 11:
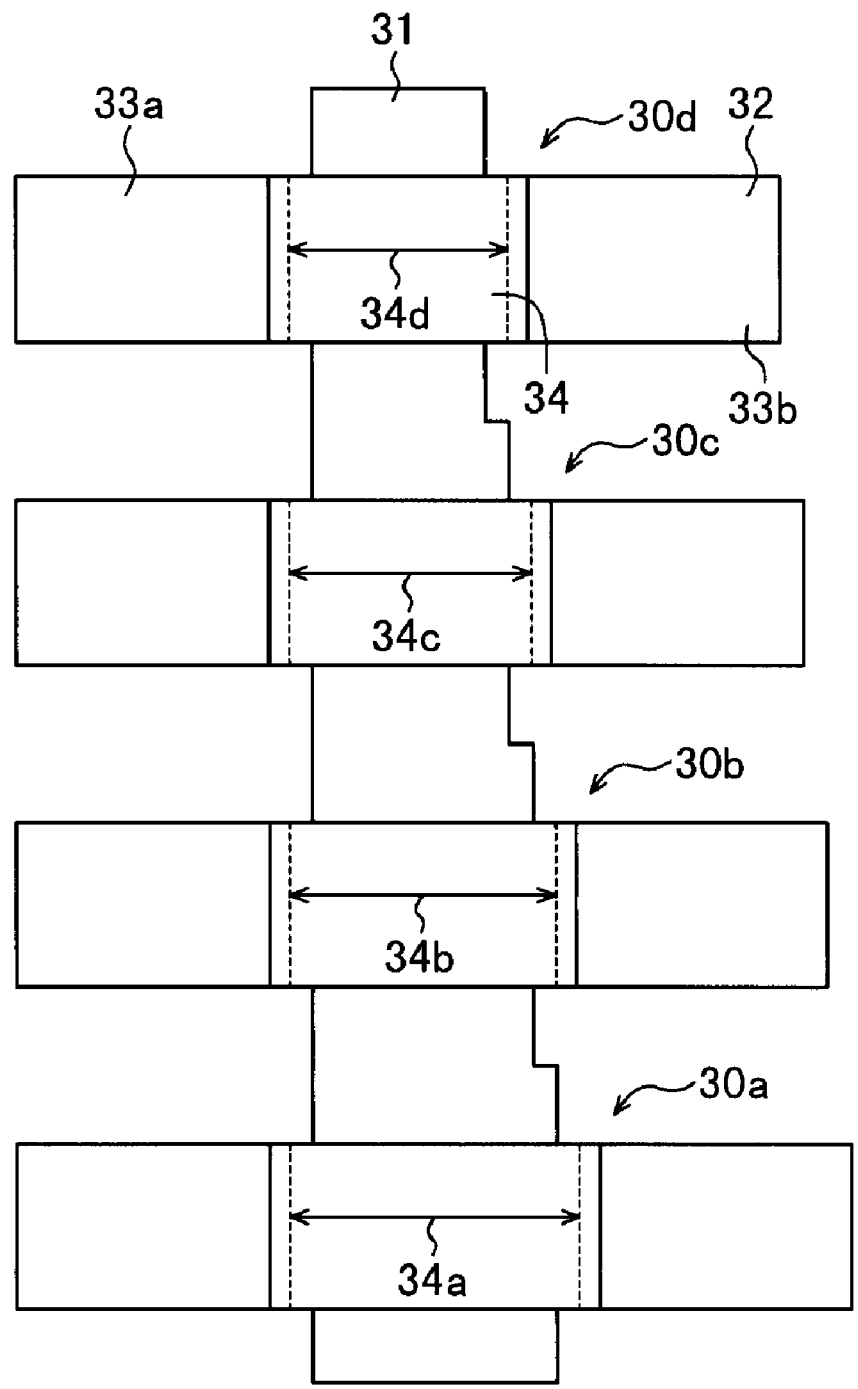
FIG. 11 is a plan view showing four MEMS vibrators using the clamped-clamped structure.

FIG. 10A is a plan view showing the basic structure of a MEMS vibrator 30 using a clamped-clamped structure; and FIG. 10B is a side view taken along line A-A' shown in FIG. 10A. FIG. 11 is a plan view showing four MEMS vibrators 30a to 30d using the clamped-clamped structure, which can be applied to the four MEMS vibrators 10a to 10d shown in FIG. 1.

As shown in FIGS. 10A and 10B, the clamped-clamped structure is not like the cantilever structure where one end of a beam is supported by a supporting portion, but the clamped-clamped structure is a structure where both ends of the beam are supported by supporting portions. Specifically, the MEMS vibrator 30 is composed of a fixed electrode 31 formed on a substrate and a movable electrode 32 formed apart from the fixed electrode 31 with a constant gap. The movable electrode 32 is composed of a first fixed portion 33a formed on one side of the fixed electrode 31 on the substrate, a second fixed portion 33b formed on the other side of the fixed electrode 31, a movable portion (beam) 34 provided to face the fixed electrode 31 and capable of vibrating, a first supporting portion 35a coupling one end of the movable portion 34 with the first fixed portion 33a and supporting them, and a second supporting portion 35b coupling the other end of the movable portion 34 with the second fixed portion 33b and supporting them.

The configuration of each of the four MEMS vibrators 30a to 30d shown in FIG. 11 is similar to that of the MEMS vibrator 30 shown in FIGS. 10A and 10B. However, beam lengths 34a to 34d are changed, whereby their resonant frequencies are different. Specifically, the MEMS vibrators 30a to 30d are formed such that the beam lengths 34a to 34d become shorter in the order from the MEMS vibrator 30a to the MEMS vibrator 30d. The beam length 34a of the MEMS vibrator 30a is longest, and the beam length 34b of the MEMS vibrator 30b, the beam length 34c of the MEMS vibrator 30c, and the beam length 34d of the MEMS vibrator 30d progressively become shorter in this order.

The fixed electrodes 31 corresponding to the respective movable electrodes 32 of the four MEMS vibrators 30a to 30d are linked to one another, and the widths of the fixed electrodes 31 progressively decrease according to the beam lengths of the respective movable electrodes 32.

Also in the first modified example, the same effect as that of the embodiment can be obtained.

Second Modified Example

Figure 12:
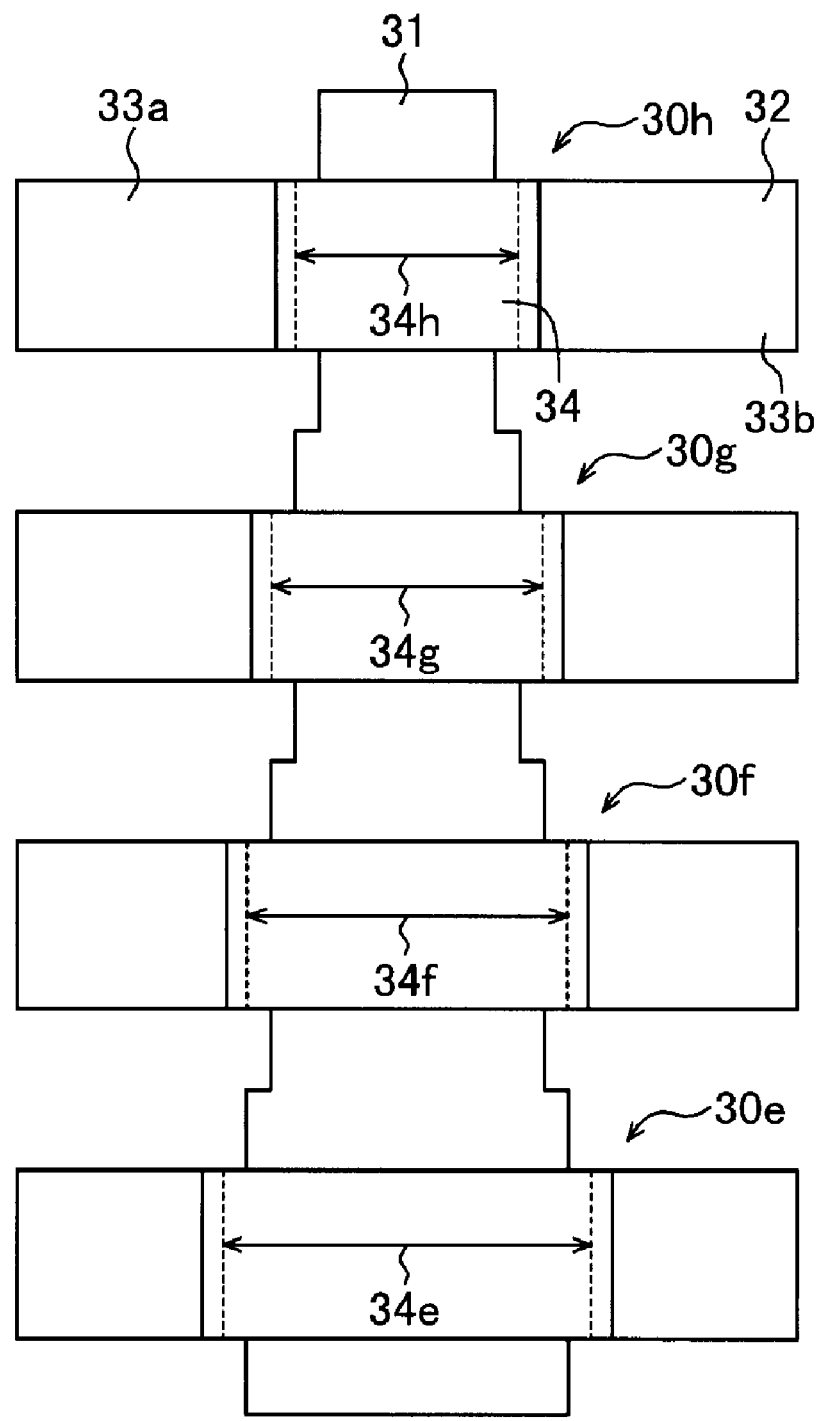
FIG. 12 is a plan view showing four MEMS vibrators using the clamped-clamped structure.

FIG. 12 is a plan view showing four MEMS vibrators 30e to 30h using the clamped-clamped structure, which can be applied to the four MEMS vibrators 10a to 10d shown in FIG. 1.

The configuration of each of the four MEMS vibrators 30e to 30h shown in FIG. 12 is similar to that of the MEMS vibrator 30 shown in FIGS. 10A and 10B. However, beam lengths 34e to 34h are changed, whereby their resonant frequencies are different, similarly to FIG. 11. Specifically, the MEMS vibrators 30e to 30h are formed such that the beam lengths 34e to 34h become shorter in the order from the MEMS vibrator 30e to the MEMS vibrator 30h. The beam length 34e of the MEMS vibrator 30e is longest, and the beam length 34f of the MEMS vibrator 30f, the beam length 34g of the MEMS vibrator 30g, and the beam length 34h of the MEMS vibrator 30h progressively become shorter in this order.

The fixed electrodes 31 corresponding to the respective movable electrodes 32 of the four MEMS vibrators 30e to 30h are linked to one another, and the widths of the fixed electrodes 31 progressively decrease according to the beam lengths of the respective movable electrodes 32. Different from the first modified example, however, the widths of the fixed electrodes 31 progressively decrease by decreasing the fixed electrode 31 from both sides thereof.

Also in the second modified example, the same effect as that of the embodiment can be obtained.

Second Embodiment

Figure 18:
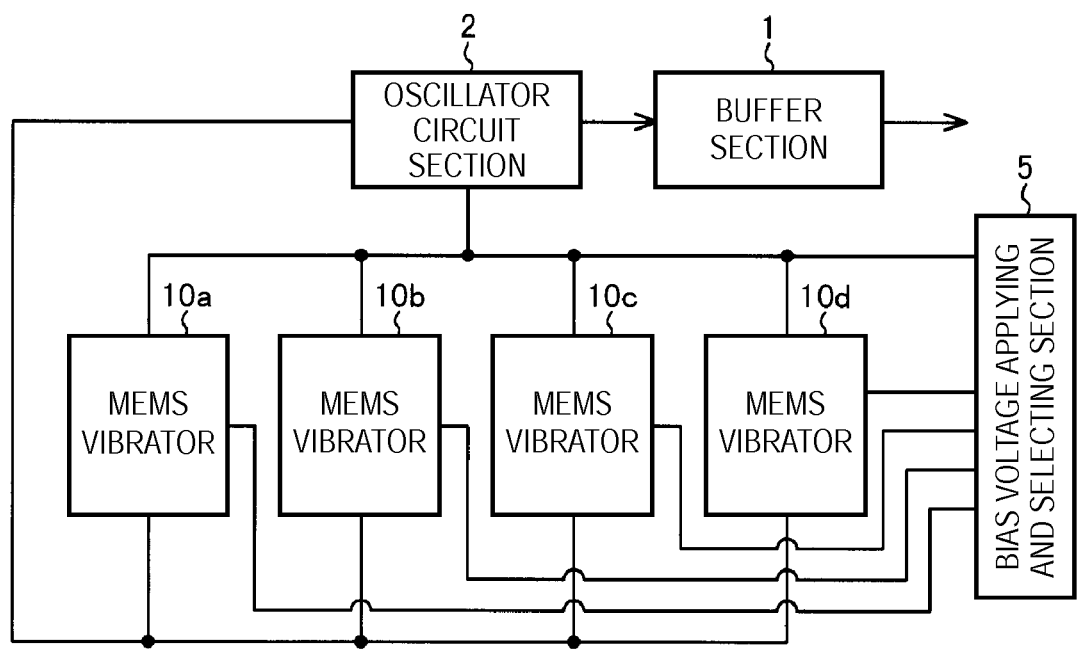
FIG. 18 is a block diagram schematically showing a MEMS oscillator according to a second embodiment.

FIG. 18 is a block diagram schematically showing a MEMS oscillator according to a second embodiment. In the drawings showing the second embodiment, the same portions as those in the drawings showing the first embodiment are denoted by the same reference numerals and signs, and only different portions from the first embodiment will be described.

An oscillator configuration circuit of the MEMS oscillator shown in FIG. 18 has the buffer section 1, the oscillator circuit section 2, and a bias voltage applying and selecting section 5. One electrode and the other electrode of each of the four MEMS vibrators 10a to 10d are electrically connected to the oscillator circuit section 2 and the bias voltage applying and selecting section 5. The bias voltage applying and selecting section 5 applies a DC bias voltage to only one selected MEMS vibrator among the four MEMS vibrators 10a to 10d. Since a MEMS vibrator to which the bias voltage is not applied does not have a vibrator function, the presence or absence of the application of the bias voltage is used as selecting means for the MEMS vibrator.

Figure 19:
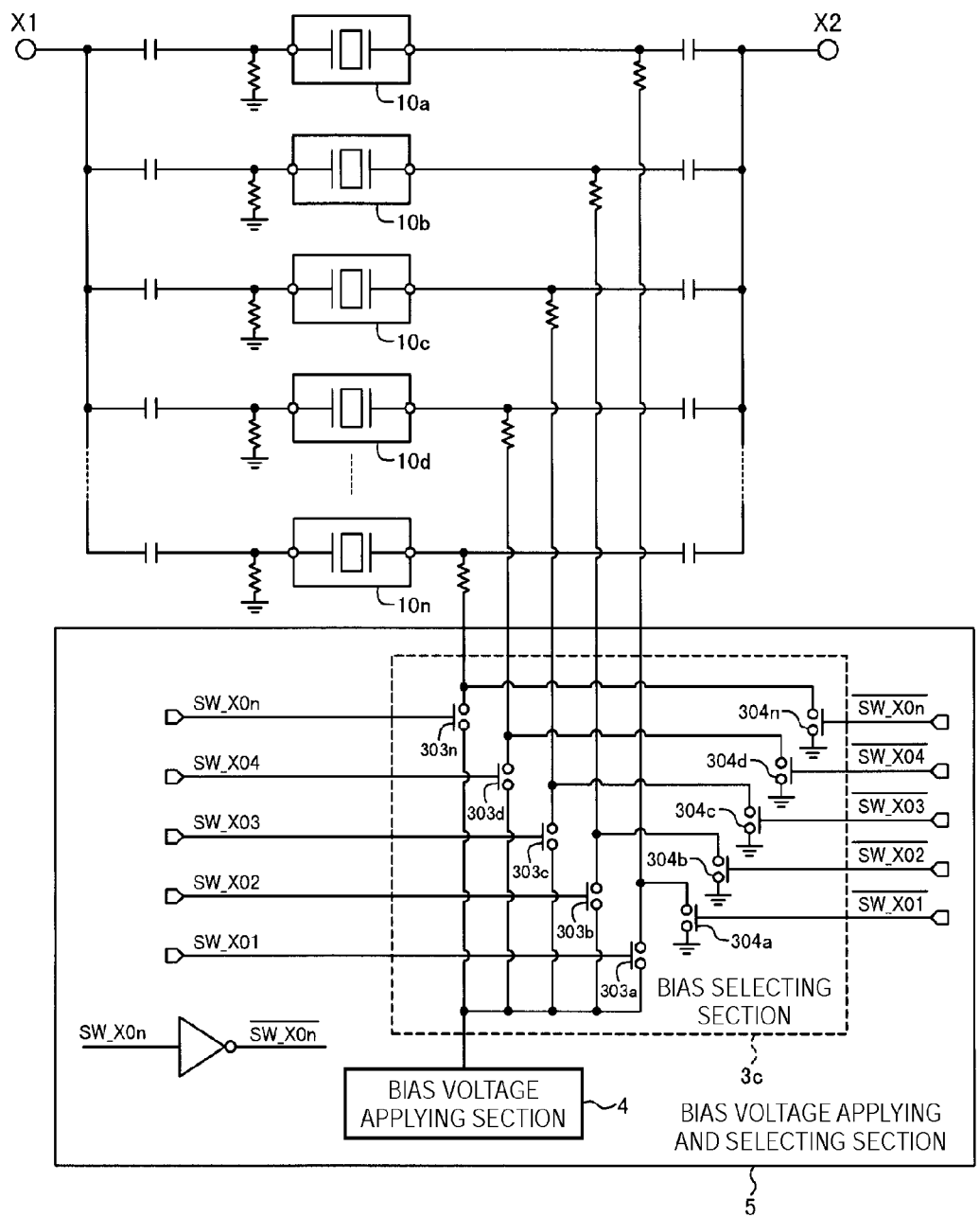
FIG. 19 is a circuit diagram for explaining a bias voltage applying and selecting section shown in FIG. 18 in detail.

FIG. 19 is a circuit diagram for explaining the bias voltage applying and selecting section 5 shown in FIG. 18 in detail, in which the same portions as those of FIG. 5 are denoted by the same reference numerals and signs, and only different portions from FIG. 5 will be described.

The bias voltage applying and selecting section 5 shown in FIG. 19 has the bias voltage applying section 4 and a bias selecting section 3c. The bias voltage applying section 4 is electrically connected to the bias selecting section 3c, and the bias selecting section 3c is electrically connected to the plurality of MEMS vibrators 10a, 10b, 10c, 10d, . . . , and 10n.

Specifically, the bias selecting section 3c has analog switches 303a to 303n and analog switches 304a to 304n electrically connected between one electrode of each of the MEMS vibrators 10a to 10n and the terminal X2, the input portion SW_X01 to SW_X0n and inversion signal input portions SW_X01 to SW_X0n (inversion signals) which input a high signal and a low signal respectively for bringing the analog switch into an on state and an off state; and fuse elements (not shown) for switching the signal input from the input portion to the analog switch from high to low or from low to high. A ground electrode is connected between the other electrode of each of the MEMS vibrators 10a to 10n and the terminal X1. The terminals X1 and X2 are electrically connected to the oscillator circuit section 2 shown in FIG. 18.

Figure 13:
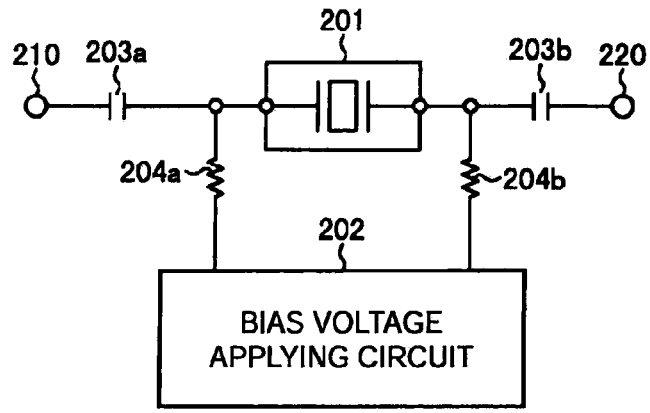
FIG. 13 shows the circuit configuration of a related-art MEMS vibrator.
Figure 14:
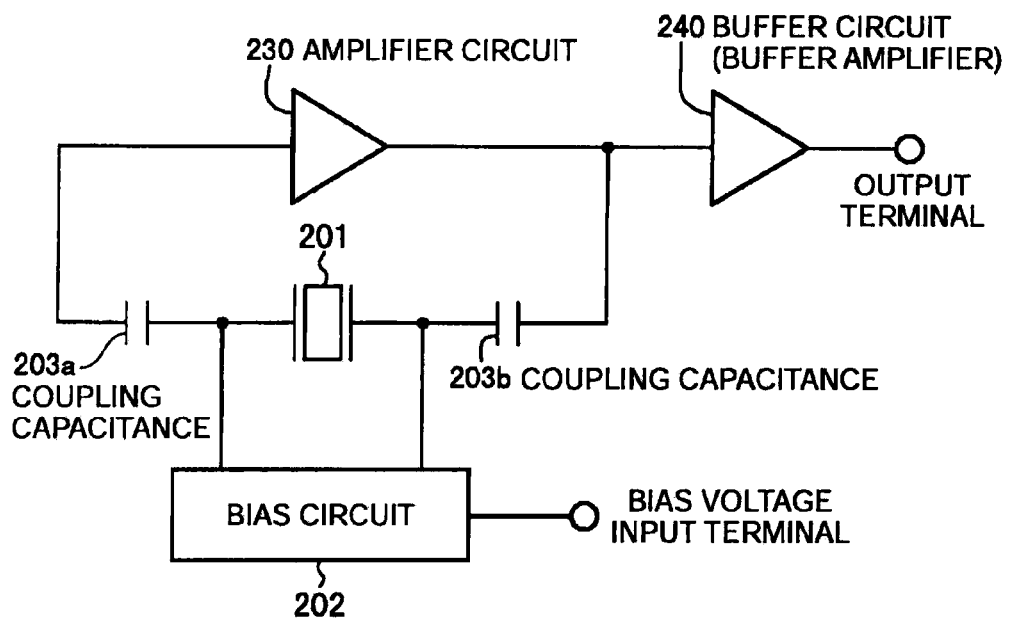
FIG. 14 shows an exemplary related-art MEMS oscillator.

A coupling capacitance is formed between one electrode of each of the MEMS vibrators 10a to 10n and the terminal X2 and between the other electrode of each of the MEMS vibrators 10a to 10n and the terminal X1, similarly to FIG. 13.

Next, a method of performing selection and non-selection of the MEMS vibrators by the bias voltage applying and selecting section 5 shown in FIG. 18 will be described with reference to FIG. 9.

First as shown in FIG. 9, a high signal is input from the input portion through the fuse to the analog switch connected between one electrode of the MEMS vibrator 10d and the oscillator circuit section 2, so that a bias voltage (for example, 2.2 V) is applied to the MEMS vibrator 10d; and a low signal is input from the input portion through the fuse to the analog switch connected between one electrode of each of the MEMS vibrators 10a to 10c and the oscillator circuit section 2, so that a bias voltage 0V is applied to the MEMS vibrators 10a to 10c. That is, the bias voltage applying and selecting section 5 applies the bias voltage (2.2 V) only to the MEMS vibrator 10d to be used and does not apply the bias voltage (2.2 V) to the MEMS vibrators 10a to 10c not to be used. Thus, only the MEMS vibrator 10d to which the bias voltage is applied is caused to oscillate by the oscillator circuit section 2 (the MEMS vibrator to which the bias voltage is not applied does not oscillate), and a resonant frequency output from the MEMS vibrator 10d is measured (S1). It is determined whether or not the measured resonant frequency is within the target accuracy range shown in FIG. 3 (S2).

If the determined result is within the target accuracy range shown in FIG. 3, the process ends without switching the switches of the bias selecting section 3c.

If the measured result of the resonant frequency is 20.55 MHz for example, it is determined that the measured resonant frequency is not within the target accuracy range (S2). In this case, the difference (250 kHz) between the measured resonant frequency (20.55 MHz) and the design value (20.3 MHz) of the resonant frequency of the MEMS vibrator 10d measured is calculated (S3). By using the calculated difference (250 kHz), the resonant frequency difference (200 kHz) in design value between the respective MEMS vibrators 10a to 10d, and the design values (19.7 MHz, 19.9 MHz, 20.1 MHz, and 20.3 MHz shown in FIG. 3) of the resonant frequencies of the MEMS vibrators 10a to 10d, it is specified which of the MEMS vibrators 10a to 10c has a resonant frequency within the target accuracy range, for example, it is specified that the MEMS vibrator 10a has a resonant frequency within the target accuracy range (S4).

Next, all the not-specified MEMS vibrators 10b to 10d are not selected by the bias selecting section 3c, and the specified one MEMS vibrator 10a is selected by the bias selecting section 3c, whereby all the not-specified MEMS vibrators 10b to 10d are brought into a state where the bias voltage cannot be applied thereto, and the specified one MEMS vibrator 10a is brought into a state where the bias voltage can be applied thereto (S5).

Thereafter, the MEMS vibrator 10a is caused to oscillate by the oscillator circuit section 2, and oscillation characteristic of the MEMS vibrator 10a is checked (S6). It is determined whether the oscillation characteristic is good or bad (S7). If the determined result is good, the process ends. If the determined result is bad, the lot is rejected.

The entire disclosure of Japanese Patent Application No. 2009-290171, filed Dec. 22, 2009 is expressly incorporated by reference herein.

What is claimed is:

1. A MEMS oscillator comprising:
a plurality of MEMS vibrators formed on a substrate; and
an oscillator configuration circuit electrically connected to the plurality of MEMS vibrators for performing an oscillation operation, wherein
the plurality of MEMS vibrators each have a beam structure,
the respective beam structures of the plurality of MEMS vibrators are different, whereby their resonant frequencies are different, and
the minimum number of the plurality of MEMS vibrators is N which satisfies the following expression:

$$N=X/Y$$

here, X is variation in a first resonant frequency caused by variation in a film thickness of the beam structure, and Y is target variation in a second resonant frequency of the MEMS oscillator.

2. The MEMS oscillator according to claim 1, wherein the oscillator configuration circuit includes
a selecting section connected to the plurality of MEMS vibrators,
a bias voltage applying section connected to the selecting section,
an oscillator circuit section for performing an oscillation operation, and
a buffer section connected to the oscillator circuit section and outputting oscillation output, and
the selecting section electrically connects selectively the bias voltage applying section to any one of the plurality of MEMS vibrators.

3. The MEMS oscillator according to claim 2, wherein the selecting section is connected to the bias voltage applying section and the oscillator circuit section, and electrically connects selectively the one MEMS vibrator connected to the bias voltage applying section to the oscillator circuit section.

4. The MEMS oscillator according to claim 2, wherein the selecting section is connected to the bias voltage applying section and the oscillator circuit section, and electrically connects the oscillator circuit section to the plurality of MEMS vibrators.

5. The MEMS oscillator according to claim 1, wherein the oscillator configuration circuit includes
a bias voltage applying and selecting section connected to the plurality of MEMS vibrators,
an oscillator circuit section for performing an oscillation operation, and
a buffer section connected to the oscillator circuit section and outputting oscillation output, and
the bias voltage applying and selecting section selectively apply the bias voltage to any one of the plurality of MEMS vibrators.

6. The MEMS oscillator according to claim 2, wherein the selecting section is configured to connect irreversibly the bias voltage applying section to one of the plurality of MEMS vibrators, and not to connect the bias voltage applying section to the other MEMS vibrators after an adjustment work of the MEMS oscillator.

7. The MEMS oscillator according to claim 2, wherein the selecting section is configured to connect reversibly the bias voltage applying section to one of the plurality of MEMS vibrators, and not to connect the bias voltage applying section to the other MEMS vibrators after an adjustment work of the MEMS oscillator.

8. The MEMS oscillator according to claim 1, wherein the beam structure has a fixed electrode formed on the substrate and a movable electrode including a beam provided to face the fixed electrode and capable of vibrating, and
the difference in the beam structure means the difference in length of the beam.

9. The MEMS oscillator according to claim 1, wherein the resonant frequencies of the plurality of MEMS vibrators are equally spaced apart.

10. A method of manufacturing a MEMS oscillator, comprising:
forming, on a substrate, a plurality of MEMS vibrators having a predetermined resonant frequency difference in design value, a selecting section to which the plurality of MEMS vibrators are connected, a bias voltage applying section and an oscillator circuit section both connected to the selecting section, and a buffer section connected to the oscillator circuit section;
selectively applying a bias voltage to any one of the plurality of MEMS vibrators by the selecting section and the bias voltage applying section, causing the one MEMS vibrator to oscillate by the oscillator circuit section, measuring a resonant frequency oscillation-output from the one MEMS vibrator by the buffer section, specifying one MEMS vibrator having a resonant frequency within a predetermined range from the plurality of MEMS vibrators; and
not selecting all the not-specified MEMS vibrators by the selecting section, and selecting the specified one MEMS vibrator by the selecting section, thereby not to electrically connect all the not-specified MEMS vibrators to the oscillator circuit section, and to electrically connect the specified one MEMS vibrator to the oscillator circuit section by the selecting section, wherein the plurality of MEMS vibrators each have a beam structure, the respective beam structures of the plurality of MEMS vibrators are different, whereby the plurality of MEMS vibrators have the predetermined resonant frequency difference, and the minimum number of the plurality of MEMS vibrators is N which satisfies the following expression:

$$N=X/Y$$

here, X is variation in a first resonant frequency caused by variation in a film thickness of the beam structure, and Y is target variation in a second resonant frequency of the MEMS oscillator.

11. The method of manufacturing the MEMS oscillator according to claim 10, wherein the selecting section has a switching portion switching the MEMS vibrator between selection and non-selection, and a fuse is used for the switching portion.

12. The method of manufacturing the MEMS oscillator according to claim 10, wherein the selecting section has a switching portion switching the MEMS vibrator between selection and non-selection, and a semiconductor memory is used for the switching portion.

* * * * *